United States Patent [19]
Cockrum et al.

[11] Patent Number: 5,646,426
[45] Date of Patent: Jul. 8, 1997

[54] CONTACT METAL DIFFUSION BARRIER FOR SEMICONDUCTOR DEVICES

[75] Inventors: Charles A. Cockrum, Goleta; Eric F. Schulte, Santa Barbara, both of Calif.

[73] Assignee: Santa Barbara Research Center, Goleta, Calif.

[21] Appl. No.: 570,740

[22] Filed: Dec. 12, 1995

[51] Int. Cl.$^6$ .................. H01L 31/0328; H01L 27/10; H01L 31/00
[52] U.S. Cl. .................. 257/188; 257/184; 257/186; 257/211; 257/442
[58] Field of Search .................. 257/184, 186, 257/188, 211, 442, 445, 459

[56] References Cited

U.S. PATENT DOCUMENTS

| | | | |
|---|---|---|---|
| 4,439,912 | 4/1984 | Pollard et al. | 29/572 |
| 4,447,291 | 5/1984 | Schulte | 257/459 |
| 4,843,446 | 6/1989 | Nishino et al. | 257/290 |
| 4,865,245 | 9/1989 | Schulte et al. | 228/116 |
| 5,216,491 | 6/1993 | Yamamoto et al. | 257/459 |
| 5,401,986 | 3/1995 | Cockrum et al. | 257/188 |
| 5,417,770 | 5/1995 | Saitoh et al. | 257/458 |
| 5,442,226 | 8/1995 | Maeda et al. | 257/588 |
| 5,523,628 | 6/1996 | Williams et al. | 257/777 |

OTHER PUBLICATIONS

H. Katteulus et al., "Diffusion Barriers in Semiconductor Contact Metallization", Diffusion Phenomena In Thin Films and Microelectronic Materials, Noyes Publications, New Jersey, copyright 1988, pp. 433-498.

*Primary Examiner*—Wael Fahmy
*Assistant Examiner*—Fetsum Abraham
*Attorney, Agent, or Firm*—W. C. Schubert; W. K. Denson-Low

[57] ABSTRACT

A photoresponsive device (10) includes a body comprised of semiconductor material comprised of elements selected from Group IIB–VIA; and at least one electrically conductive contact pad (20) formed over a surface of the semiconductor material. The at least one electrically conductive contact pad is comprised of metal nitride, such as MoN, and serves as a diffusion barrier between an Indium bump (22a, 22b) and the underlying semiconductor material. A passivation layer (18), such as a layer of wider bandgap CdTe, can be formed to overlie the surface of said semiconductor material. A p-n junction is contained within a mesa structure (10a) that comprises a portion of an n-type base layer (14) and a p-type cap layer (16). A first contact pad is disposed over the cap layer and a second contact pad is disposed over the base layer. The device further includes a first layer (24a) comprised of Au that is disposed between a bottom surface of the first contact pad and the cap layer; a second layer (24b) comprised of Cr that is disposed between a bottom surface of the second contact pad and the base layer; and a third layer (26) comprised of nickel that is disposed upon a top surface of the first and second contact pads. A first In bump (22a) is disposed upon the third layer over the first contact pad and a second indium bump (22b) disposed upon the third layer over the second contact pad. The metal nitride is applied, preferably, by a reactive sputtering technique.

13 Claims, 2 Drawing Sheets

CONTACT METAL DIFFUSION BARRIER FOR SEMICONDUCTOR DEVICES

FIELD OF THE INVENTION

This invention relates generally to methods for fabricating semiconductor devices and, in particular, to methods for fabricating photo-responsive semiconductor devices that include contact metalization.

BACKGROUND OF THE INVENTION

One conventional technique for coupling an array of photoresponsive detectors to a readout integrated circuit employs indium (In) contacts or bumps between individual detectors and their associated readout circuits. The resulting hybrid photodetector/readout circuit is subsequently installed within a suitable imaging system. One conventional type of array is constructed of Group II-VI (e.g., HgCdTe) photovoltaic, infrared (IR) radiation responsive p-n diodes. In this case the hybrid photodetector/readout circuit may be installed within an evacuated container or dewar for maintaining the array at cryogenic temperatures during operation.

However, several undesirable effects have been observed when In, from the In bump which forms the electrical and mechanical bond between a HgCdTe detector and its readout circuit, comes in contact with the active HgCdTe material. First, the In has been observed to create defects in the HgCdTe. These defects cause excess leakage current to flow through the diode if the defect dislocations penetrate the p-n junction, or if they are located in the low doped, n-type side of the diode (and within a diffusion length of the p-n junction). Second, the defects provide a path through which In and Au, if Au is also used in the metal contact system, can diffuse to the p-n junction. The diffused metals can result in a short circuit across the p-n junction. Third, if In comes into contact with Au it forms a brittle intermetallic alloy which can cause the contact metal to separate from the underlying HgCdTe.

It is noted that all of these effects are accelerated when the detector is raised to elevated temperatures, as is typically the case during the vacuum bake of the dewar which houses the detector and/or during storage.

It is known to employ a layer of Ni between the In bump and the HgCdTe or a layer of Au metallization on the HgCdTe. However, the Ni interlayer has been found to not be acceptable in reliably preventing the diffusion of In into either the HgCdTe or the Au contact metallization.

U.S. Pat. No. 4,439,912 (Pollard et al.) teaches the use of a molybdenum (Mo) layer that is overcoated with an Au/Ge layer to form connecting leads to a HgCdTe epitaxial detector array that is formed on a CdTe substrate. In this application the Mo leads are said to have excellent matches to the coefficients of thermal expansion (CTE) of HgCdTe and CdTe.

Commonly assigned U.S. Pat. Nos. 5,296,384 and 5,401,986 (C. A. Cockrum et al.) teach a photoresponsive device that includes semiconductor material, such as a cap region, that is comprised of elements selected from Group IIB-VIA. A low diffusion characteristic, non-reactive refractory contact pad is formed upon a surface of the cap region. A preferred material for the contact pad is disclosed to be molybdenum. A wide bandgap semiconductor passivation or overglass layer overlies the surface of the cap region and also partially overlies the contact pad. A dielectric layer overlies the passivation layer, and an indium bump is formed upon the contact pad.

Reference may also be had "Diffusion Phenomena in Thin Films and Microelectronic Materials", Ed. by D. Gupta and P. S. Ho, Noyes Publications (1988), pgs. 432–498 for a discussion of diffusion barriers in semiconductor contact metallization. TiN is described as a well-known single phase compound diffusion barrier, and $MoSi_2$, in combination with Al, is referred to at page 461 also for this purpose. At page 477 it is said that the silicides can be used as primary contacting layer, and not as a diffusion barrier. An example of a PtSi contacting layer with a TiN diffusion barrier is given at page 478. Table 4 lists the use of rf sputtered $MoN_x$ as a diffusion barrier in combination with a Si substrate, a Mo contacting layer, and a /Mo/Au metal overlayer.

OBJECTS OF THE INVENTION

It is a first object of this invention to provide an improved contact metal system that overcomes the foregoing and other problems.

It is a second object of this invention to provide a layer of metal nitride between an In bump and an underlying layer of semiconductor material.

It is a third object of this invention to provide a layer of metal nitride, in combination with a metal layer forming an ohmic contact, between an In bump and a Group II-VI photodetector.

It is a fourth object of this invention to provide a layer of metal nitride, in combination with a first metal layer forming an ohmic contact and a second metal layer that enhances adhesion, between an In bump and a Group II-VI photodetector.

SUMMARY OF THE INVENTION

The foregoing and other problems are overcome and the objects of the invention are realized by a photoresponsive device, and a method of fabricating same, that includes an electrical contact or electrode that is comprised of a layer of metal nitride that functions as a diffusion barrier between In and underlying Group IIB-VIA semiconductor material (e.g., HgCdTe).

In accordance with this invention a photoresponsive device includes a body comprised of semiconductor material comprised of elements selected from Group IIB-VIA; and at least one electrically conductive contact pad formed over a surface of the semiconductor material. The at least one electrically conductive contact pad is comprised of metal. A passivation layer, such as a layer of wider bandgap CdTe, can be formed to overlie the remaining surface of said semiconductor material.

In a preferred, but not limiting, embodiment a p-n junction is contained within a mesa structure that comprises a portion of an n-type base layer and a p-type cap layer. A first contact pad is disposed over the cap layer and a second contact pad is disposed over the base layer. The device further includes a first layer comprised of Au that is disposed between a bottom surface of the first contact pad and the cap layer; a second layer comprised of Cr that is disposed between a bottom surface of the second contact pad and the base layer; and a third layer comprised of nickel that is disposed upon a top surface of the first and second contact pads. A first In bump is disposed upon the third layer over the first contact pad and a second indium bump disposed upon the third layer over the second contact pad.

The metal nitride is applied, preferably, by a reactive sputtering technique. In a preferred reactive sputtering technique a metal target is provided within an argon and nitrogen atmosphere. A ratio of 8:2 argon/nitrogen at a pressure of 1 millitorr has been found to be suitable. The metal nitride in this example is comprised of molybdenum and has a thickness of, by example, 1500 Å.

The deposited metal nitride material has been found to be substantially amorphous, as compared to substantially polycrystalline Ni or Mo. The amorphous nature of the metal nitride material has been found to provide improved resistance to the diffusion of In, as compared to polycrystalline Ni or Mo, while exhibiting acceptable electrical resistivity.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Although described below in the context of a fabrication process for PV detectors having a mesa geometry, it should be realized that the teaching of the invention is applicable also to planar arrays of PV detectors, and also to the fabrication of photoconductive (PC) IR detectors comprised of Group IIB–VIA semiconductor material. Furthermore, it should be realized that the teaching of this invention can be extended to other than radiation detectors, and can be used to advantage with semiconductor materials/metal systems other than those containing Group II–VI materials such as, by example, Group III–V materials including GaAs and InP.

Figure 1:
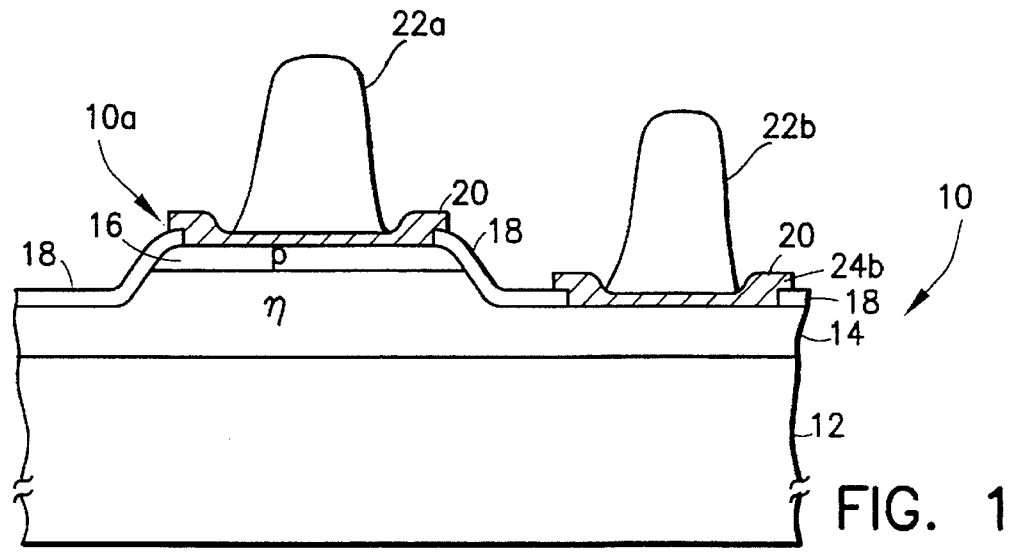
FIG. 1 is a cross-sectional view, not to scale, of a photodetector that is constructed in accordance with a first embodiment of this invention.

Reference is made to FIG. 1 for showing a portion of an array 10 having a single mesa structure 10a. It should be realized that a typical array of radiation detectors would comprise a significantly larger number of mesa structures arranged in a linear or a two-dimensional array.

Processing begins with an n-type radiation absorbing HgCdTe base layer 14 that is grown on an electrically insulating and transparent substrate 12. The substrate 12 is selected to be transparent at wavelengths of interest, specifically those wavelengths that are desired to be absorbed within the base layer 14. One suitable method for growing the base layer 14 on the substrate 12 is by Liquid Phase Epitaxy (LPE), although Molecular Beam Epitaxy (MBE) and Metal-Organic Chemical Vapor Deposition (MOCVD) are also suitable growth techniques. A suitable material for the substrate 12 is CdZnTe. The bandgap of the HgCdTe semiconductor material of the base layer 14 is selected for absorbing radiation having the wavelengths of interest and is set, in a known fashion, by varying the relative concentrations of the Hg and Cd atoms in accordance with the relationship: $Hg_{(1-x)}Cd_{(x)}Te$, where (x) is a nonzero number that is less than one. Upon the base layer 14 is then epitaxially grown a p$^+$-type HgCdTe cap layer 16. The cap layer 16 may be grown, by example, by LPE, MBE, or by MOCVD. A suitable dopant species for the n-type base layer 12 is indium, and a suitable dopant species for the p-type cap layer 16 is arsenic.

Individual photodiodes are delineated by a mesa etch process. Suitable techniques use bromine/ethylene-glycol or bromine/methanol, in conjunction with a photolithographically applied mask. The result of the mesa etch is to differentiate the p-type cap layer 16, and a portion of the underlying n-type base layer 14, into a plurality of electrically isolated p-n junctions each of which is contained within a mesa 10a.

A next step overcoats the structure formed thus far with a layer 18 of, preferably, a wide bandgap Group IIB–VIA semiconductor material, i.e., the bandgap is wider than the bandgap of either the base layer 14 and the cap layer or region 16. The wide bandgap semiconductor material may be, by example, CdTe, CdZnTe, or CdSeTe. One suitable technique is to blanket deposit CdTe to a depth of approximately 4000 Å by a thermal evaporation process. Other suitable deposition techniques include MBE, MOCVD, and sputtering. The effect of this step is to cover the exposed surface of the n-type base layer 14 and the exposed surface of the p-type cap layer 16 with a layer or film of the wide bandgap semiconductor material. It should be noted that the passivation layer 18 is not required to be a wide bandgap Group II–VI semiconductor material.

A next step applies a mask to the passivation layer 18 and then opens windows through the passivation layer 18 to expose the underlying HgCdTe. Within the open window areas, through a photolithographically applied mask, is then deposited an electrical contact in accordance with this invention. In FIG. 1 the contact 20 is comprised of a metal nitride, such as MoN, which is applied, preferably, by a reactive sputtering technique. In a preferred reactive sputtering technique a metal target (e.g., a target containing molybdenum) is provided within an argon and nitrogen atmosphere. A ratio of 8:2 argon/nitrogen at a pressure of 1 millitorr has been found to be suitable. The contact 20 has a thickness of, by example, 1500 Å.

One suitable reactive sputtering apparatus is available from Consolidated Vacuum Corporation, and is referred to as a Planar Magnetron Sputtering System.

The deposited metal nitride material has been found to be substantially amorphous, as compared to the substantially polycrystalline Mo that is disclosed for use in the above referenced commonly-assigned U.S. Pat. Nos. 5,296,384 and 5,401,986. The amorphous nature of the metal nitride material has been found to provide improved resistance to the diffusion of In, as compared to polycrystalline Mo, while exhibiting acceptable electrical resistivity.

After depositing the contact 20, and lifting off the mask and adhering metal nitride, first and second indium bumps 22a and 22b are formed and processed in a known fashion. By example, reference can be had to commonly assigned U.S. Pat. No. 4,865,245 by E. F. Schulte et al. entitled "Oxide Removal From Metallic Contact Bumps Formed On Semiconductor Devices To Improve Hybridization Cold-Welds". Subsequent processing hybridizes the array 10 with a suitable readout circuit (not shown).

Figure 2:
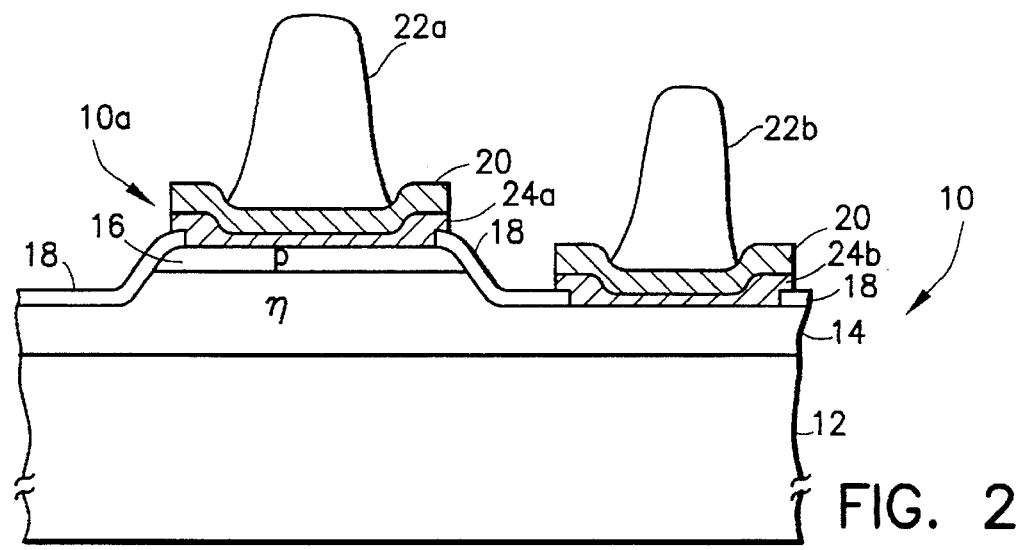
FIG. 2 is a cross-sectional view, not to scale, of a photodetector that is constructed in accordance with a second embodiment of this invention.

The embodiment of FIG. 2 is similar to the embodiment of FIG. 1 except for a metallic interlayer applied between the HgCdTe and the metal nitride contacts 20. By example, when contacting the p$^+$HgCdTe material of the cap layer 16 a gold contact 24a having a thickness of, by example, 500 Å is applied by a thermal evaporation process. For contacting the n-type HgCdTe of the base layer 14 it is preferred to use a metal such as chromium. In this case the Cr contact 24b is applied by thermal evaporation to a thickness of, by example, 500 Å. The Au contact 24a and the Cr contact 24b both function as ohmic contacts to the underlying HgCdTe material.

In this embodiment of the invention the metal nitride contact 20 serves to also isolate the In bump 22a from the Au ohmic contact 24a, and thus precludes the formation of a brittle intermetallic alloy which can cause the Au contact metal to separate from the underlying HgCdTe.

Figure 3:
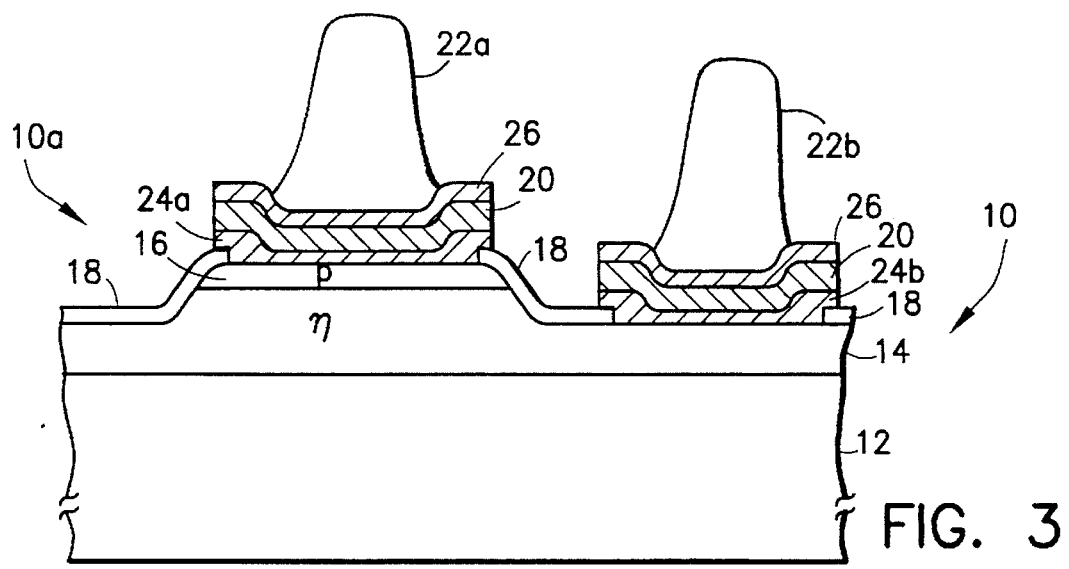
FIG. 3 is a cross-sectional view, not to scale, of a photodetector that is constructed in accordance with a third embodiment of this invention.

The embodiment of FIG. 3 is similar to the embodiment of FIG. 2 with the exception of a thin (e.g., 300 Å) layer 26 of nickel that is applied over the metal nitride layer 20. The Ni layer 26 is preferably also applied by sputtering. The Ni layer 26 has been found to improve the adhesion of the In bumps 22a and 22b to the metal nitride contacts 20.

Figure 4:
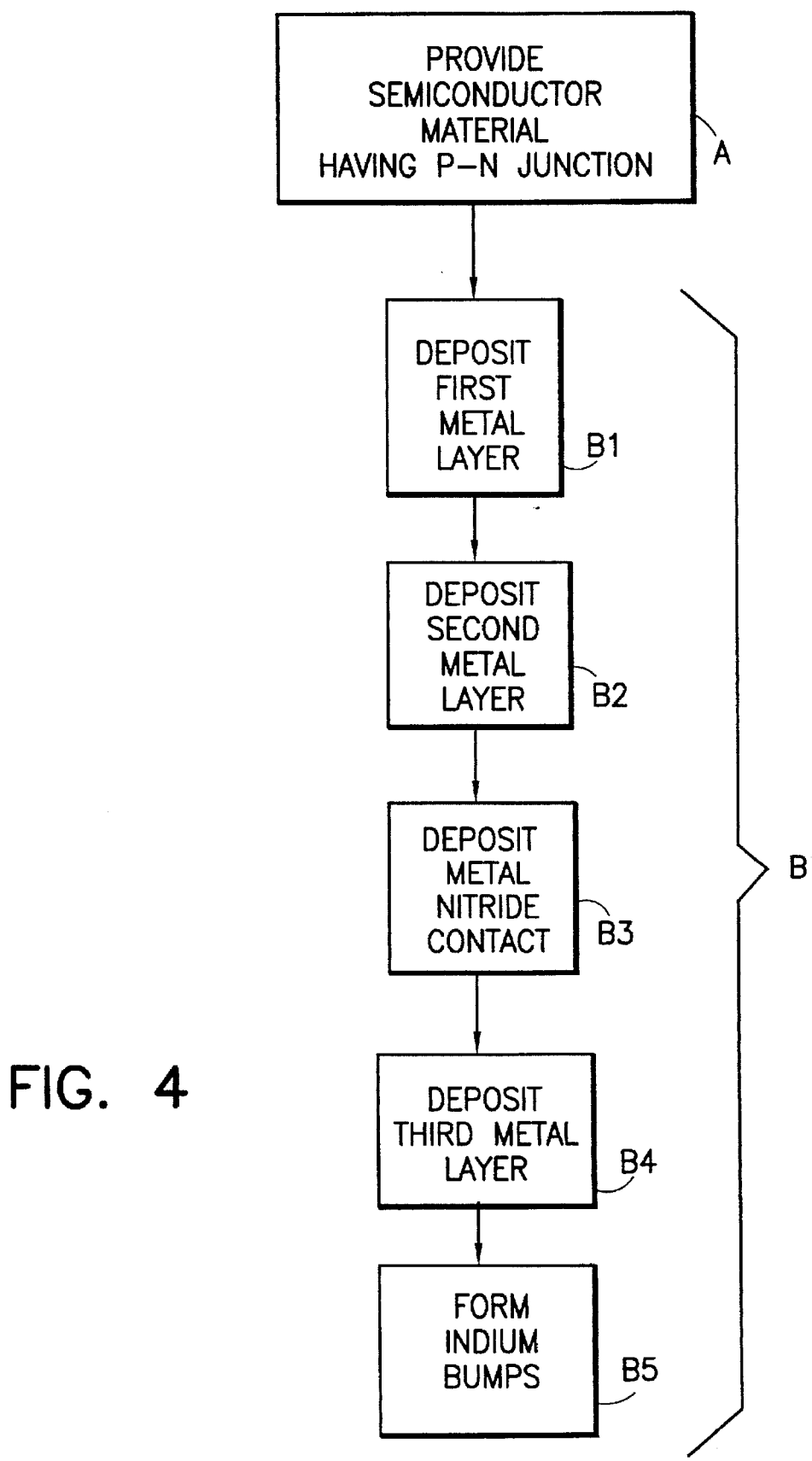
FIG. 4 is a process flow diagram that illustrates a method of this invention.

In accordance with a method of this invention, and referring to FIG. 4, a process for fabricating a photoresponsive device includes the steps of: providing a p-n junction between a base layer, comprised of Group IIB–VIA semiconductor material having a first type of electrical conductivity, and a cap region comprised of Group IIB–VIA semiconductor material having a second type of electrical conductivity (Block A); and forming a first contact electrode upon the cap region and a second contact electrode upon the base layer, the first and second contact electrodes each being comprised of a metal nitride (Blocks B).

The first and second contact pads may be formed by a reactive sputtering technique that uses a metal target in an atmosphere that contains nitrogen. In an exemplary embodiment of this invention the first and second contact pads are formed by a reactive sputtering technique that uses a molybdenum target in an atmosphere comprised of an approximately eight to two ratio of an inert gas to nitrogen.

The step of forming at Block B may include the sub-steps of depositing a first metal layer comprised of Au upon the cap region (B1); depositing a second metal layer comprised of Cr upon the base layer (B2); and depositing the metal nitride layer upon the first and second metal layers (B3). Further sub-steps of Block B include depositing a third metal layer comprised of Ni upon the metal nitride layer (B4); and forming a first indium bump disposed upon the third metal layer over the base region and forming a second indium bump upon the third metal layer over the base layer (B5).

Although described above in the context of specific fabrication processes, layer thicknesses and materials, it should be realized that these are exemplary of the teaching of this invention, and should not be construed in a limiting sense upon the practice of this invention. By example, metal nitrides other than Mon can be used for forming the contact pad(s), such as metal nitrides containing elements from Group IVB (i.e., titanium, zirconium, and hafnium). Also, the layer thicknesses may be adjusted as required, and may therefore have values that differ from the examples given above.

Thus, while the invention has been particularly shown and described with respect to preferred embodiments thereof, it will be understood by those skilled in the art that changes in form and details may be made therein without departing from the scope and spirit of the invention.

What is claimed is:

1. A semiconductor device, comprising:
    a photoresponsive body comprised of semiconductor material, said body having at least one electrical contact that is electrically coupled to said body, said at least one electrical contact being comprised of indium; and
    at least one electrically conductive contact pad formed over a surface of said semiconductor material and interposed between said surface and said at least one electrical contact, said at least one electrically conductive contact pad being comprised of at least one layer, said at least one layer being comprised of a metal nitride that is selected to be resistant to a diffusion of indium from said at least one electrical contact.

2. A semiconductor device as set forth in claim 1, wherein said metal nitride is comprised of MoN.

3. A semiconductor device as set forth in claim 1, wherein said metal nitride is comprised of an element selected from Group IVB.

4. A semiconductor device as set forth in claim 1, and further comprising a passivation layer overlying said surface of said semiconductor material.

5. A semiconductor device as set forth in claim 4, wherein said passivation layer is comprised of a semiconductor material having a bandgap selected to be wider than a bandgap of said semiconductor material.

6. A semiconductor device as set forth in claim 1, and further comprising a layer of metal that is disposed between said contact pad and said surface of said semiconductor material, said layer of metal being selected for forming an ohmic contact between said contact pad and said semiconductor material.

7. A semiconductor device as set forth in claim 1, and further comprising a layer of metal that is disposed between said contact pad and said electrical contact, said layer of metal being selected for improving an adhesion between said electrical contact and said contact pad.

8. A semiconductor device as set forth in claim 1, and further comprising:
    a first layer comprised of metal that is disposed between a bottom surface of said contact pad and said semiconductor material for providing an ohmic contact between said contact pad and said semiconductor material; and
    a second layer comprised of metal that is disposed upon a top surface of said contact pad; wherein
    said electrical contact is comprised of an indium bump disposed upon said second layer of metal, said metal of said second layer of metal being selected for improving an adhesion of said indium bump to said electrical contact.

9. A semiconductor device as set forth in claim 8, wherein said contact pad has a thickness of about 1500 Å, wherein said first layer of metal is comprised of one of gold and chromium and has a thickness of about 500 Å, and wherein said second layer of metal is comprised of nickel and has a thickness of about 300 Å.

10. A semiconductor device as set forth in claim 1, wherein said device includes a p-n junction.

11. A semiconductor device comprising:
    a photoresponsive body comprised of semiconductor material; and
    at least one electrically conductive contact pad formed over a surface of said semiconductor material, said at least one electrically conductive contact pad being comprised of at least one layer, said at least one layer being comprised of a metal nitride, wherein said device includes a p-n junction and wherein said semiconductor material is comprised of Group IIB–VIA material, wherein said p-n junction is contained within a mesa structure that comprises a portion of an n-type base layer and a p-type cap layer, wherein a first contact pad is disposed over said cap layer, wherein a second contact pad is disposed over said base layer, and further comprising:

a first layer comprised of Au that is disposed between a bottom surface of said first contact pad and said cap layer;

a second layer comprised of Cr that is disposed between a bottom surface of said second contact pad and said base layer;

a third layer comprised of nickel that is disposed upon a top surface of said first and second contact pads; and a first indium bump disposed upon said third layer over said first contact pad and a second indium bump disposed upon said third layer over said second contact pad, said at least one layer comprised of a metal nitride selected to be resistant to a diffusion of indium from said first and second indium bumps.

12. An array of photovoltaic sensors of infra-red (IR) radiation, comprising:

a substrate;

a plurality of mesa structures disposed over a first surface of said substrate, each of said mesa structures comprising a p-n junction between p-type Group IIB–VIA and n-type Group IIB–VIA semiconductor material, each of said mesa structures comprising an electrically conductive cap layer that is electrically coupled to said p-n junction;

a first metal layer disposed upon said cap layer;

a metal nitride layer disposed upon said first metal layer;

a second metal layer disposed upon said metal nitride layer; and an indium bump disposed upon said second metal layer; wherein said metal nitride layer is comprised of a metal nitride selected for being resistant to a diffusion of indium from said indium bump for minimizing an amount of indium that diffuses to said first metal layer and to said semiconductor material.

13. An array of photovoltaic sensors as set forth in claim 12 wherein said metal nitride layer is comprised of MoN.

* * * * *